United States Patent
Qian

(10) Patent No.: US 9,852,808 B2
(45) Date of Patent: Dec. 26, 2017

(54) MEMORY TESTING CIRCUIT AND TESTING METHOD USING SAME

(71) Applicant: SHANGHAI HUAHONG GRACE SEMICONDUCTOR MANUFACTURING CORPORATION, Shanghai (CN)

(72) Inventor: Liang Qian, Shanghai (TW)

(73) Assignee: Shanghai Huanhong Grace Semiconductor Manufacturing Corporation, Shanghai (CN)

( * ) Notice: Subject to any disclaimer, the term of this patent is extended or adjusted under 35 U.S.C. 154(b) by 13 days.

(21) Appl. No.: 14/978,885

(22) Filed: Dec. 22, 2015

(65) Prior Publication Data

US 2016/0225465 A1    Aug. 4, 2016

(30) Foreign Application Priority Data

Jan. 31, 2015   (CN) .......................... 2015 1 0052256

(51) Int. Cl.
  *G11C 29/00*   (2006.01)
  *G11C 29/38*   (2006.01)
  (Continued)

(52) U.S. Cl.
  CPC .......... *G11C 29/38* (2013.01); *G11C 29/1201* (2013.01); *G11C 29/12015* (2013.01);
  (Continued)

(58) Field of Classification Search
  CPC ... G11C 29/38; G11C 29/36; G11C 29/12015; G11C 29/1201
  See application file for complete search history.

(56) References Cited

U.S. PATENT DOCUMENTS

| 2006/0036389 A1* | 2/2006 | Ozora | G01R 31/319 702/108 |
| 2010/0007366 A1* | 1/2010 | Watanabe | G01R 31/31908 324/750.3 |

(Continued)

FOREIGN PATENT DOCUMENTS

| CN | 1979200 A | 6/2007 |
| CN | 101196555 A | 6/2008 |

(Continued)

*Primary Examiner* — Thien D Nguyen
(74) *Attorney, Agent, or Firm* — Muncy, Geissler, Olds & Lowe, P.C.

(57) ABSTRACT

A memory testing circuit and method are disclosed, the redesigning of a memory to be tested through incorporation therein a testing circuit includes a self-test circuit incorporating a decoder circuit, and a VPPIO I/O module incorporating an encoder circuit and having multiple functions including digital I/O, high analog voltage I/O and current I/O. An oscillator module embedded in the multiplexer circuit provides a clock signal for the testing. The VPPIO I/O module is configured to convert, by the self-test circuit, a stimulating input from a single signal pin to a parallel signal recognizable by the memory and an analog voltage/current signal, thereby accomplishing proper testing of the memory. This enables a single signal pin to test all functions of one memory, thereby increasing the number of memory dies on a wafer tested in parallel by a test instrument and reducing the testing time per wafer as well as testing cost.

15 Claims, 1 Drawing Sheet

(51) Int. Cl.
  *G11C 29/12* (2006.01)
  *G11C 29/36* (2006.01)
  *G11C 29/48* (2006.01)
  *G11C 16/00* (2006.01)

(52) U.S. Cl.
  CPC .............. *G11C 29/36* (2013.01); *G11C 29/48* (2013.01); *G11C 16/00* (2013.01)

(56) References Cited

U.S. PATENT DOCUMENTS

| | | | |
|---|---|---|---|
| 2011/0234381 A1* | 9/2011 | Kang | G06K 7/0008 340/10.4 |
| 2014/0084988 A1* | 3/2014 | Mishra | H03K 17/6871 327/437 |
| 2014/0185399 A1* | 7/2014 | Park | G11C 29/56008 365/201 |

FOREIGN PATENT DOCUMENTS

| | | |
|---|---|---|
| CN | 101592706 A | 12/2009 |
| CN | 103617810 A | 3/2014 |

* cited by examiner

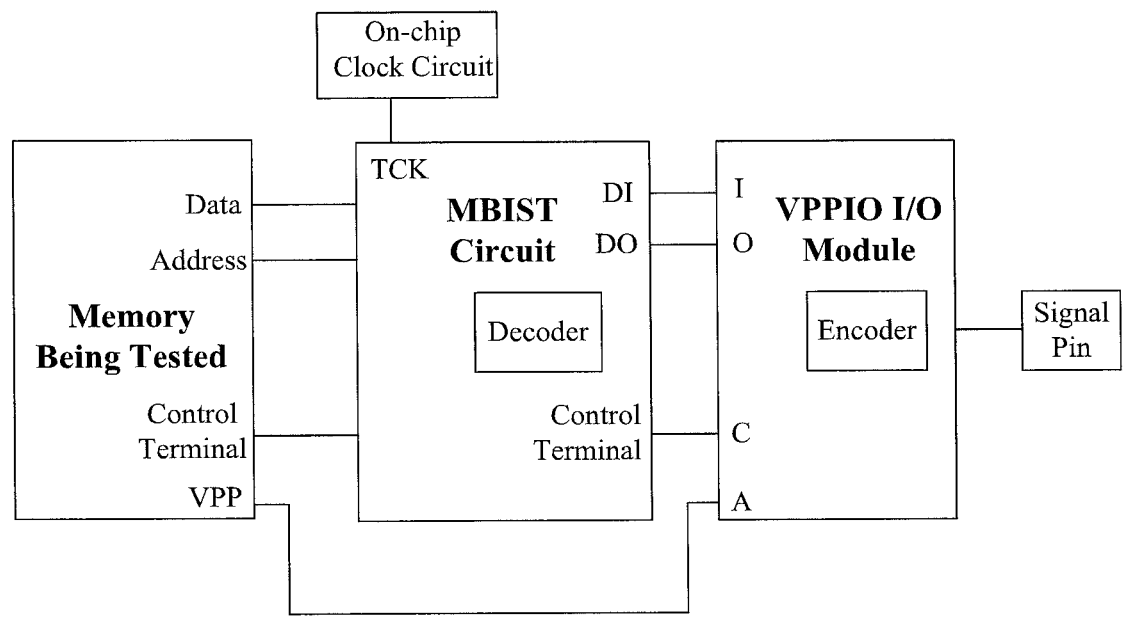

MEMORY TESTING CIRCUIT AND TESTING METHOD USING SAME

CROSS-REFERENCES TO RELATED APPLICATIONS

This application claims the priority of Chinese patent application number 201510052256.1, filed on Jan. 31, 2015, the entire contents of which are incorporated herein by reference.

TECHNICAL FIELD

This invention relates to fabrication of semiconductor devices and, more particularly, to a memory testing circuit and a testing method using same.

BACKGROUND

Development of semiconductor memory devices (e.g., flash memories, embedded memories, etc.) always follows the direction toward high-integration, high-capacity memory cells. In designing of flash memories, a variety of error checking and correction means are generally incorporated to ensure a high product yield of the flash memories.

Testability design techniques of memories (e.g., embedded memories) may include direct testing, embedded CPU-based testing and Built-in Self-Test (BIST).

BIST is a technique that allows a device to test itself by a relevant functional portion embedded in the circuit of the device and hence reduces its dependence on automated test equipment. Nowadays, highly integrated circuits are being widely used, which require high-speed mixed-signal test equipments for their testing. Thanks to its self-test function, use of BIST technique can reduce the need for such automated test equipments. Memory Built-in Self-Test (MBIST) is a technique incorporating one or more algorithms specially designed to test one or more types of defects in memories.

Due to high requirements on CP (Chip Probing) test time and cost, improvement efforts in memory testing have been pursuing reductions in testing time. As the time for testing of Erase, Program and Read functions cannot be shortened, a scheme in which multiple memories are tested in parallel has to be employed in order to reduce the testing time. Conventionally, testing of one memory device usually involves the use of 6, 4 or 2 signal pins, and a test instrument with 768 signal pins can therefore simultaneously handle 128, 256 or 384 memories, respectively. However, with the density, and also the number, of chip dies that can be formed on a single wafer increasing continuously, testing time required by the conventional scheme per wafer will become longer and longer, which will lead to increasing test cost.

SUMMARY OF THE INVENTION

It is the objective of the present invention to provide a memory testing circuit and a testing method using same, which allow memory testability based on a single signal pin and thus can result in a significant increase in the number of memories testable in parallel and hence a reduction in the testing time, for a given number of signal pins of the used test instrument, i.e., given testing cost.

In pursuit of this objective, a memory testing circuit according to the present invention for testing a memory having an analog voltage I/O terminal includes: a VPPIO I/O module having an analog terminal, a first digital input terminal and a first digital output terminal, the analog terminal is coupled to the analog voltage I/O terminal of the memory, the VPPIO I/O module is configured to transmit an analog signal in a stimulating input from a single signal pin to the analog voltage I/O terminal of the memory and/or to encode a digital signal in the stimulating input; a self-test circuit coupled to the memory and having a clock terminal, a second digital input terminal and a second digital output terminal, the second digital input terminal and the second digital output terminal are coupled to the first digital input terminal and the first digital output terminal of the VPPIO I/O module, respectively, the self-test circuit is configured to receive an encoded digital signal from the VPPIO I/O module, decode the encoded digital signal into a parallel signal and output the parallel signal to the memory; and an on-chip clock circuit coupled to the clock terminal of the self-test circuit and configured to provide a clock signal to the self-test circuit, wherein the self-test circuit and the VPPIO I/O module are further configured to receive a feedback signal from the memory and determine whether the feedback signal is consistent with an expected signal or not, thereby accomplishing the testing of the memory.

Additionally, the VPPIO I/O module may include an encoder circuit configured to encode the digital signal in the stimulating input from the single signal pin.

Additionally, encoding the digital signal in the stimulating input may include attaching a header to a beginning of the digital signal and a trailer to an end of the digital signal.

Additionally, the self-test circuit may be provided with a decoder circuit for decoding the encoded digital signal from the VPPIO I/O module.

Additionally, the memory may further have a first data terminal, a first address terminal and a first control terminal coupled to a second data terminal, a second address terminal and a second control terminal of the self-test circuit, respectively.

Additionally, the digital signal may be indicative of one or more of an erase mode, a program mode, a read mode, a test mode and a switch VPPIO status.

Additionally, the self-test circuit may be configured to control the VPPIO I/O module to transmit a digital signal or an analog signal.

Additionally, the self-test circuit may be configured to control the VPPIO I/O module to be in an input state or an output state, and to, upon the VPPIO I/O module being set to output an analog signal, directly transmit the analog signal to the memory via the analog terminal of the VPPIO I/O module.

Additionally, the on-chip clock circuit may be implemented as an oscillator or a frequency divider.

A memory testing method according to the present invention using the memory testing circuit as defined above includes the steps of:

the VPPIO I/O module transmitting an analog signal in a stimulating input from a single signal pin to an analog voltage I/O terminal of a memory and/or encoding a digital signal in the stimulating input;

the self-test circuit receiving an encoded digital signal from the VPPIO I/O module, decoding the encoded digital signal into a parallel signal and outputting the parallel signal to the memory; and receiving a feedback signal from the memory via the self-test circuit and the VPPIO I/O module and determining whether the feedback signal is consistent with an expected signal or not, thereby accomplishing the testing of the memory.

Additionally, in the memory testing method, the VPPIO I/O module may include an encoder circuit configured to encode the digital signal in the digital signal from the single signal pin.

Additionally, in the memory testing method, encoding the digital signal in the stimulating input may include attaching a header to a beginning of the digital signal and a trailer to an end of the digital signal.

Additionally, in the memory testing method, the self-test circuit may be provided with a decoder circuit for decoding the encoded digital signal from the VPPIO I/O module.

Additionally, in the memory testing method, the digital signal may indicate one or more of an erase mode, a program mode, a read mode, a test mode and a switch VPPIO status.

Additionally, the memory testing method may further include controlling, by the self-test circuit, the VPPIO I/O module to transmit a digital signal or an analog signal.

Additionally, the memory testing method may further include controlling, by the self-test circuit, the VPPIO I/O module to be in an input state or an output state, and upon the VPPIO I/O module being set to output an analog signal, directly transmitting the analog signal to the memory via the analog terminal of the VPPIO I/O module.

Additionally, in the memory testing method, the feedback signal may include a digital signal and/or an analog signal.

The invention provides a number of benefits over the prior art. It allows redesigning of a memory to be tested through incorporation therein a testing circuit including a memory built-in self-test (MBIST) circuit and a VPPIO I/O module with multiple functions including digital I/O, high analog voltage I/O and current I/O. An oscillator module embedded in the multiplexer circuit provides a clock signal for the testing. The VPPIO I/O module is configured to convert, by the MBIST circuit, a serial stimulating input from a single signal pin to a parallel signal recognizable by the memory and an analog voltage/current signal, thereby accomplishing proper testing of the memory. This enables one single signal pin to test all functions of one memory, thereby increasing the number of memory dies on a wafer tested in parallel by a test instrument and reducing the testing time per wafer as well as testing cost.

BRIEF DESCRIPTION OF THE DRAWINGS

The sole FIGURE is a diagrammatic illustration of a memory testing circuit in accordance with an embodiment of the present invention.

DETAILED DESCRIPTION

Circuits and methods for memory testing in accordance with the present invention will be described in greater detail in the following description which presents preferred embodiments of the invention, in conjunction with the accompanying drawing. It is to be appreciated that those of skill in the art can make changes in the invention disclosed herein while still obtaining the beneficial results thereof. Therefore, the following description shall be construed as being intended to be widely known by those skilled in the art rather than as limiting the invention.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time-consuming but would nevertheless be a routine undertaking for those of ordinary skill in the art.

The present invention will be further described in the following paragraphs by way of example with reference to the accompanying drawing. Features and advantages of the invention will be more apparent from the following detailed description, and from the appended claims. Note that the accompanying drawing is provided in a very simplified form not necessarily presented to scale, with the only intention of facilitating convenience and clarity in explaining a few exemplary embodiments of the invention.

Referring to the sole FIGURE, in this embodiment, a memory testing circuit for testing a memory (Flash IP) includes: a memory built-in self-test (MBIST) circuit, a VPPIO I/O module (VPPIO) and an on-chip clock circuit.

The on-chip clock circuit is coupled to a clock terminal (TCK) of the MBIST circuit. The memory to be tested (hereinafter called "memory" for short) is coupled to a data terminal (Data), an address terminal (Address) and a control terminal (Control) of the MBIST circuit. An analog voltage I/O terminal (VPP) of the memory is coupled to an analog terminal (A) of the VPPIO I/O module. The analog terminal can output an analog signal. A digital input terminal (DI) and digital output terminal (DO) of the MBIST circuit are couple to a digital input terminal (I) and digital output terminal (O) of the VPPIO I/O module, respectively.

The VPPIO I/O module includes an encoder circuit configured to transmit an analog signal in a stimulating input from a single signal pin to the analog voltage I/O terminal of the memory and/or to encode a digital signal in the stimulating input.

The MBIST circuit is provided with a decoder circuit configured to decode the stimulating input that is from a single signal pin or from the VPPIO I/O module.

In this embodiment, the VPPIO I/O module is capable of transmitting both digital and analog signals. It is configured to transmit the stimulating input from the single signal pin and a feedback signal from the MBIST circuit or the memory. Whether the VPPIO I/O module transmits a digital signal or an analog signal is determined under the control of the MBIST circuit. Accordingly, the MBIST circuit also controls the VPPIO I/O module to be in an input state or an output state.

The clock circuit is an oscillator module (OSC) or a frequency divider. The memory includes a digital circuit which itself incorporates a clock circuit embedded in the MBIST circuit. In accordance with this invention, the oscillator module provides a clock signal to the MBIST circuit.

The decoder circuit is arranged in the MBIST circuit and is configured to decode the stimulating input from the single signal pin or from the VPPIO I/O module. The stimulating input complies with an encoding scheme so that the decoder circuit can read the stimulating input. As an example, the payload information of the digital signal in the stimulating input may be provided with a header and a trailer for identifying a type of the signal, for example, a digital signal or an analog signal, or a voltage signal or a current signal in case of the analog signal.

In another aspect of this embodiment, a memory testing method using the above-specified memory testing circuit is also provided, the memory testing method including the steps of:

transmitting a stimulating input (an encoded signal) from a single signal pin to the MBIST circuit module via the VPPIO I/O module, or transmitting an analog signal such as a voltage signal or a current signal from the single signal pin directly to the memory via the VPPIO I/O module;

the MBIST circuit module decoding and converting the stimulating input into a parallel signal and outputting the parallel signal to the memory, or the MBIST circuit module spontaneously generating another stimulating input and outputting it to the memory; and receiving a feedback signal from the memory via the MBIST circuit module and the VPPIO I/O module and determining whether the feedback signal is consistent with an expected signal or not, thereby accomplishing the testing of the memory.

In this embodiment, the stimulating input is from one single signal pin of the used test instrument and can be transmitted to the VPPIO I/O module through this single signal pin. Compared to the prior art in which at least two signal pins are used, the method according to this embodiment can achieve an at least two times increase in the number of memories testable in parallel.

In this embodiment, the VPPIO I/O module includes an encoder circuit which encodes the parallel signal. The encoding includes attaching a header to the beginning of the parallel signal and a trailer to the end of the parallel signal. For instance, the encoded parallel signal may assume the form of:

(header: 1001000100001; parallel signal; trailer: 0110111011110).

The parallel signal may indicate one or more of an Erase mode, a Program mode, a Read mode, a test mode and a switch VPPIO status. A digital signal may be used to control the VPPIO I/O module to or not to output an analog signal. In addition, a digital output state may be fed back using a high or low electrical level.

As described above, this embodiment enables testability based on only one signal pin, thus resulting in a significant reduction in cost, a significant increase in the number of memories testable in parallel and shortening of testing cycle. In addition, its application in a product is easily achievable and can facilitate programming and debugging.

In conclusion, in the memory testing circuit and method, the redesigning of the memory to be tested through incorporation therein a testing circuit includes a MBIST circuit and a VPPIO I/O module with multiple functions including digital I/O, high analog voltage I/O and current I/O. An oscillator module embedded in the multiplexer chip provides a clock signal for the testing. The VPPIO I/O module is configured to convert, by the MBIST circuit, a serial stimulating input from a single signal pin to a parallel signal recognizable by the memory and an analog voltage/current signal, thereby accomplishing proper testing of the memory. This enables one single signal pin to test all functions of one memory, thereby increasing the number of memory dies on a wafer tested in parallel by a test instrument and reducing the testing time per wafer as well as testing cost.

The foregoing description presents merely several preferred embodiments of the present invention and is not intended to limit the invention in any way. Any variations such as equivalent substitutions or modifications made to the subject matter or features disclosed herein by any person skilled in the art are all considered to be within the scope of the invention.

What is claimed is:

1. A memory testing circuit for testing a memory having an analog voltage I/O terminal, comprising:
    a VPPIO I/O module having an encoder circuit, an analog terminal, a first digital input terminal and a first digital output terminal, the analog terminal coupled to the analog voltage I/O terminal of the memory, the VPPIO I/O module coupled to a single signal pin of a test instrument for receiving a stimulating input therefrom, the stimulating input including an analog signal or a digital signal, the VPPIO I/O module configured to transmit the analog signal in the stimulating input from the single signal pin to the analog voltage I/O terminal of the memory or to encode the digital signal in the stimulating input using the encoder circuit;
    a self-test circuit coupled to the memory and having a decoder circuit, a clock terminal, a second digital input terminal and a second digital output terminal, the second digital input terminal and the second digital output terminal coupled to the first digital input terminal and the first digital output terminal of the VPPIO I/O module, respectively, the self-test circuit configured to receive an encoded digital signal from the VPPIO I/O module, decode the encoded digital signal into a parallel signal using the decoder circuit and output the parallel signal to the memory; and
    an on-chip clock circuit coupled to the clock terminal of the self-test circuit and configured to provide a clock signal to the self-test circuit,
    wherein the VPPIO I/O module, the self-test circuit and the on-chip clock circuit are independent from one another; and
    wherein the self-test circuit and the VPPIO I/O module are further configured to receive a feedback signal from the memory and determine whether the feedback signal is consistent with an expected signal or not, thereby accomplishing testing of the memory.

2. The memory testing circuit of claim 1, wherein encoding the digital signal in the stimulating input comprises attaching a header to a beginning of the digital signal and a trailer to an end of the digital signal.

3. The memory testing circuit of claim 1, wherein the memory further includes a first data terminal, a first address terminal and a first control terminal coupled to a second data terminal, a second address terminal and a second control terminal of the self-test circuit, respectively.

4. The memory testing circuit of claim 1, wherein the digital signal indicates one or more of an erase mode, a program mode, a read mode, a test mode and a switch VPPIO status.

5. The memory testing circuit of claim 1, wherein the self-test circuit is configured to control the VPPIO I/O module to transmit a digital signal or an analog signal.

6. The memory testing circuit of claim 5, wherein the self-test circuit is configured to control the VPPIO I/O module to be in an input state or an output state, and to, upon the VPPIO I/O module being set to output an analog signal, directly transmit the analog signal to the memory via the analog terminal of the VPPIO I/O module.

7. The memory testing circuit of claim 1, wherein the on-chip clock circuit is an oscillator or a frequency divider.

8. A memory testing method using a memory testing circuit as defined in claim 1, comprising the steps of:
    a VPPIO I/O module receiving a stimulating input from a single signal pin, the stimulating input including an analog signal or a digital signal, the VPPIO I/O module transmitting the analog signal to an analog voltage I/O terminal of a memory or encoding the digital signal;
    a self-test circuit receiving an encoded digital signal from the VPPIO I/O module, decoding the encoded digital signal into a parallel signal and outputting the parallel signal to the memory; and receiving a feedback signal from the memory via the self-test circuit and the VPPIO I/O module and determining whether the feedback signal is consistent with an expected signal or not, thereby accomplishing testing of the memory.

9. The memory testing method of claim 8, wherein the VPPIO I/O module comprises an encoder circuit configured to encode the digital signal in the digital signal from the single signal pin.

10. The memory testing method of claim 9, wherein encoding the digital signal in the stimulating input comprises attaching a header to a beginning of the digital signal and a trailer to an end of the digital signal.

11. The memory testing method of claim 8, wherein the self-test circuit is provided with a decoder circuit for decoding the encoded digital signal from the VPPIO I/O module.

12. The memory testing method of claim 8, wherein the digital signal indicates one or more of an erase mode, a program mode, a read mode, a test mode and a switch VPPIO status.

13. The memory testing method of claim 8, further comprising controlling, by the self-test circuit, the VPPIO I/O module to transmit a digital signal or an analog signal.

14. The memory testing method of claim 8, further comprising controlling, by the self-test circuit, the VPPIO I/O module to be in an input state or an output state, and upon the VPPIO I/O module being set to output an analog signal, directly transmitting the analog signal to the memory via the analog terminal of the VPPIO I/O module.

15. The memory testing method of claim 8, wherein the feedback signal comprises a digital signal or an analog signal.

* * * * *